United States Patent
Hsu et al.

(10) Patent No.: US 6,306,760 B1
(45) Date of Patent: Oct. 23, 2001

(54) METHOD OF FORMING A SELF-ALIGNED CONTACT HOLE ON A SEMICONDUCTOR WAFER

(75) Inventors: Hsin-Tuei Hsu, Chu-Tung; Yuang-Chang Lin, Feng-Yuan; Wen-Jeng Lin, Pan-Chiao, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/457,327

(22) Filed: Dec. 9, 1999

(51) Int. Cl.[7] .................................................. H01L 21/265
(52) U.S. Cl. .......................... 438/639; 438/643; 438/637; 438/258
(58) Field of Search ..................................... 438/258, 241, 438/305, 586, 639, 696, 702, 787, 791, 595, 637, 643

(56) References Cited

U.S. PATENT DOCUMENTS

| | | | |
|---|---|---|---|
| 5,324,680 | * | 6/1994 | Lee ........................................... 437/52 |
| 5,449,634 | * | 9/1995 | Inoue ....................................... 437/52 |
| 5,670,404 | * | 9/1997 | Dai ........................................... 437/52 |
| 5,728,595 | * | 3/1998 | Fukase ..................................... 437/44 |
| 5,874,330 | * | 2/1999 | Ahn ........................................ 438/230 |
| 5,907,779 | * | 5/1999 | Choi ....................................... 438/279 |
| 5,935,875 | * | 8/1999 | Lee ........................................ 438/737 |
| 5,998,252 | * | 12/1999 | Huang .................................... 438/241 |
| 6,043,116 | * | 3/2000 | Kuo ....................................... 438/233 |
| 6,074,912 | * | 6/2000 | Lin ........................................ 438/253 |
| 6,150,223 | * | 11/2000 | Chern .................................... 438/303 |

* cited by examiner

Primary Examiner—Mary Wilczewski
Assistant Examiner—David Goodwin
(74) Attorney, Agent, or Firm—Winston Hsu

(57) ABSTRACT

The present invention relates to a method of forming a self-aligned contact hole on a semiconductor wafer. The semiconductor wafer comprises a substrate, an array area and a periphery area. The array area comprises a first gate electrode and a second gate electrode adjacent to the first gate electrode. The periphery area comprises at least a third gate electrode. A first doped area is formed over each of two opposite sides of each gate electrode. A first spacer is formed on a wall of each of the two opposite sides of the third gate electrode in the periphery area. Then, a second spacer is formed on a wall of each of the two opposite sides of the first and second gate electrodes in the array area. The first spacers are thicker than the second spacers, and the second spacers between the first and second gate electrodes are internal walls of a self-aligned contact hole between the first and second gate electrodes.

17 Claims, 6 Drawing Sheets

US 6,306,760 B1

METHOD OF FORMING A SELF-ALIGNED CONTACT HOLE ON A SEMICONDUCTOR WAFER

BACKGROUND OF THE INVENTION

1. Field of the Invention

The present invention relates to a method of forming a self-aligned contact hole on a semiconductor wafer, and more particularly, to a method of forming a self-aligned contact hole with a large contact area on a semiconductor wafer.

2. Description of the Prior Art

For years, the self-aligned contact (SAC) etching technology has been widely used in the manufacturing processes for dynamic random access memory (DRAM) and embedded dynamic random access memory (e-DRAM). It is used, for example, when making a contact hole in a DRAM chip through which a memory cell on the DRAM chip connects with a bit line. A small amount of misalignment can be tolerated when using the SAC technology in the prior art method of forming a self-aligned contact hole. However, owing to the increasing integration of semiconductor devices, and the limitation of the width of the spacers of a metal-oxide-semiconductor (MOS) transistor, the prior art method of forming a self-aligned contact hole has a disadvantage that the decreasing contact area results in an increased resistivity of the contact plug.

Please refer to FIG. 1 to FIG. 5. FIG. 1 to FIG. 5 are cross-sectional diagrams of the prior art method of forming a self-aligned contact hole on a semiconductor wafer. Please refer to FIG. 1. A cross-sectional view of a portion of a silicon substrate 12 with a partially completed DRAM cell is shown. A semiconductor wafer comprises the silicon substrate 12 and a shallow, dielectric-filled trench 14 located on the surface of the silicon substrate 12 that isolates the individual device regions. The silicon substrate 12 comprises an array area 20 that comprises an array of memory cells of dynamic random access memory, and a periphery area 30 located on the substrate 12 comprising a control circuit of the DRAM. The array of memory cells in the array area 20 comprises a first gate electrode 16, and a second gate electrode 16 adjacent to the first gate electrode 16. The control circuit in the periphery area 30 comprises at least a third gate electrode 18.

As shown in FIG. 2, in the prior art method the lightly doped drain (LDD) areas 22 that are used to prevent short channel effects are first formed adjacent to the gate electrodes 16, 18. Usually, the gate electrodes 16, 18 are used as part of the implantation mask, and N-type dopant species such as arsenic or phosphorus are implanted into the substrate. Next, a silicon dioxide buffer oxide layer 24, and a silicon nitride layer (not shown in FIG. 2) are sequentially formed on the silicon substrate 12 using a chemical vapor deposition (CVD) process. The buffer oxide layer 24 serves to reduce the thermal stress of the silicon nitride layer. The silicon nitride layer is used to form subsequent spacers 25. The preferred thickness of the buffer oxide layer 24 is typically between 100 to 200 Angstroms. As shown in FIG. 3, after depositing the buffer oxide layer 24 and the silicon nitride layer, an anisotropic dry etching process is used to form the spacers 25 on the walls of opposite sides of the gate electrodes 16, 18.

Referring next to the FIG. 4, an ion implantation process follows to form the source 27 and drain 28 in the periphery area 30, and a subsequent annealing process is used to restore the lattice structure which is damaged by the incident atoms and electrons during the implantation process. Then, a second silicon nitride layer 29, acting as the salicide block mask (SAB) in the formation of a salicide layer 26, is formed over the array area 20 by a CVD process. Furthermore, in order to reduce the contact resistance to the source 27 and drain 28, a silicidation process is performed on the surface of the source 27 and drain 28 to form a silicide layer, wherein titanium and cobalt are typically used as the metal source in the silicidation process.

Referring next to the FIG. 5, an inter-poly dielectric layer 32 is formed on the surface of the semiconductor wafer 10 by a CVD process. Then, a photoresist layer (not shown) is formed on at he surface of the semiconductor wafer 10, and a photo-lithographic process is performed to define the location of the self-aligned contact hole. Finally, a wet etching process is performed to remove the photoresist layer over the contact hole and a self-aligned contact dry etching process is used to complete the self-aligned contact hole 34.

Referring still to FIG. 5, damage to the buffer oxide layer 24 is observed after the self-aligned contact etching process in the prior art. The inter-poly dielectric layer 32 and the buffer oxide layer 24 are both composed of silicon dioxide. Hence, the plasma etches both of the layers during the self-aligned contact etching process.

Please refer to FIG. 6. FIG. 6 is a cross-sectional diagram of the prior art method of forming a polysilicon plug in the self-aligned contact hole. After completing the self-aligned contact hole 34, a polysilicon plug is formed in the contact hole 34 so as to make electrical connections between the circuits and the semiconductor regions. However, the damage to the buffer oxide layer 24 adjacent to the gate electrodes 16, 18 results in contact between the gate and the plug, thereby forming a short circuit after the formation of the polysilicon plug.

As integration of semiconductor devices and the density of memory cells in and on a DRAM chip increase, the contact area 36 at the bottom of the self-aligned contact hole 34 shrinks. A small contact area may result in an undesirable high resistivity, which increases the signal transfer time and energy consumption of a semiconductor device. In order to reduce the contact plug resistivity, it is desirable to make the contact area as large as possible for the DRAM fabrication process.

Unfortunately, the contact area 36 is limited by the thickness of the spacers 25 in the prior art. As shown in FIG. 5, the thickness of the spacers 25 in the periphery area 30 is the same as the spacers 25 in the array area 20 because they are all formed at the same time. The width of the lightly doped drain areas 22 with respect to the thickness of the spacers 25 will significantly influence the electrical properties of a metal-oxide-semiconductor (MOS) transistor in the periphery area 30. Thin spacers result in narrow lightly doped drain areas, which can cause serious thermal electron problems in the MOS transistor. Consequently, it is impossible to increase the contact area 36 by reducing the thickness of the spacers 25 in the array area 20 in the prior art. A solution to this problem is of considerable importance.

The main disadvantage of the prior art method of forming a self-aligned contact hole is that it cannot provide sufficient contact area 36 to the source 27 and drain 28 in the array area 20. This results in a high resistivity that reduces the performance of the semiconductor device.

SUMMARY OF THE INVENTION

It is therefore a primary objective of the present invention to provide a method of forming a self-aligned contact hole on a semiconductor wafer to solve the above mentioned problem.

In a preferred embodiment, the present invention relates to a method of forming a self-aligned contact hole on a semiconductor wafer. The semiconductor wafer comprises a substrate, an array area comprising all of the memory cells of a DRAM and a periphery area comprising a control circuit of a DRAM. The array area and the periphery area are both located on the surface of the substrate. The array of memory cells in the array area comprises a first gate electrode and a second gate electrode adjacent to the first gate electrode. The control circuit in the periphery area comprises at least a third gate electrode. The method comprises:

- forming a first doped area over each of two opposite sides of each gate electrode;
- forming a first spacer on a wall of each of the two opposite sides of the third gate electrode in the periphery area; and
- forming a second spacer on a wall of each of the two opposite sides of the first and second gate electrodes in the array area;
- wherein the first spacers are thicker than the second spacers, and the second spacers between the first and second gate electrodes are internal walls of a self-aligned contact hole between the first and second gate electrodes.

It is an advantage of the present invention that the method of forming a self-aligned contact hole on a semiconductor wafer can increase the contact area of a self-aligned contact hole so that the resistivity can be reduced to be as small as possible.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
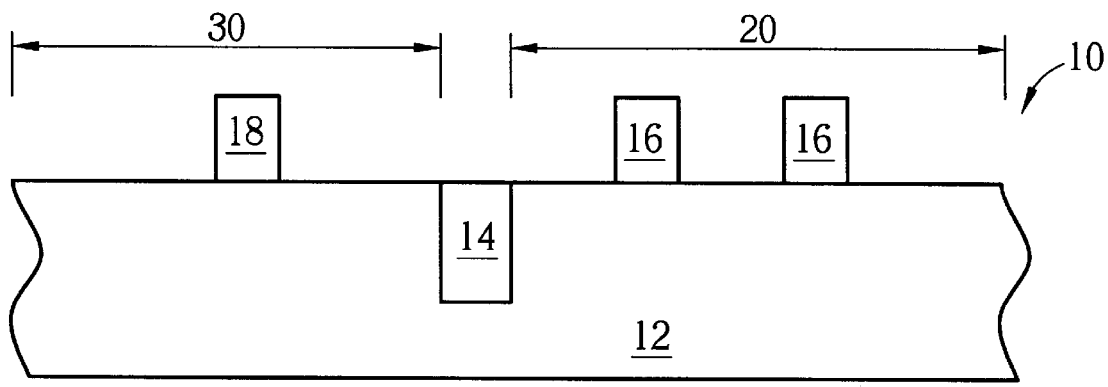
FIG. 1 to FIG. 5 are cross-sectional diagrams of the prior art method of forming a self-aligned contact hole on a semiconductor wafer.
Figure 2:
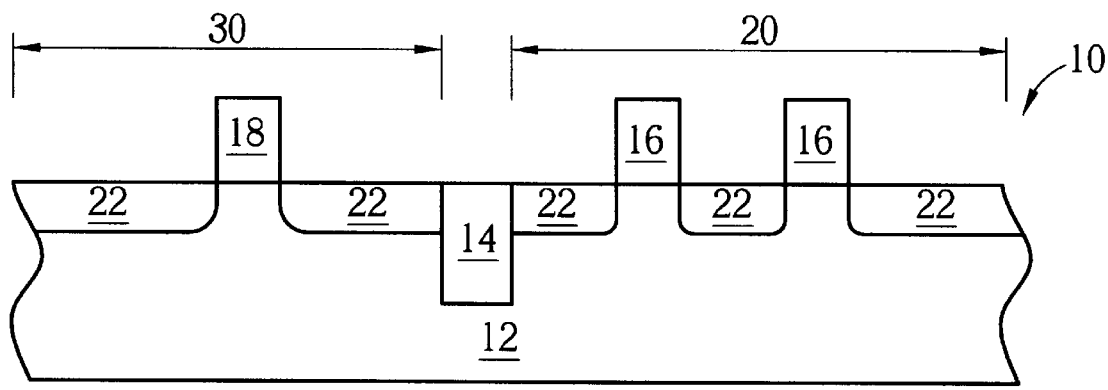
Figure 3:
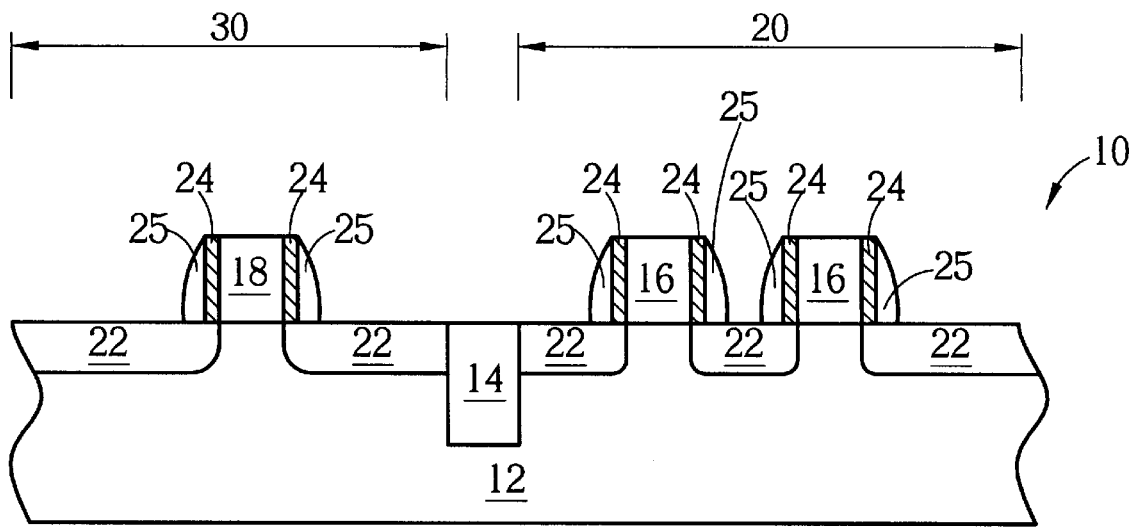
Figure 4:
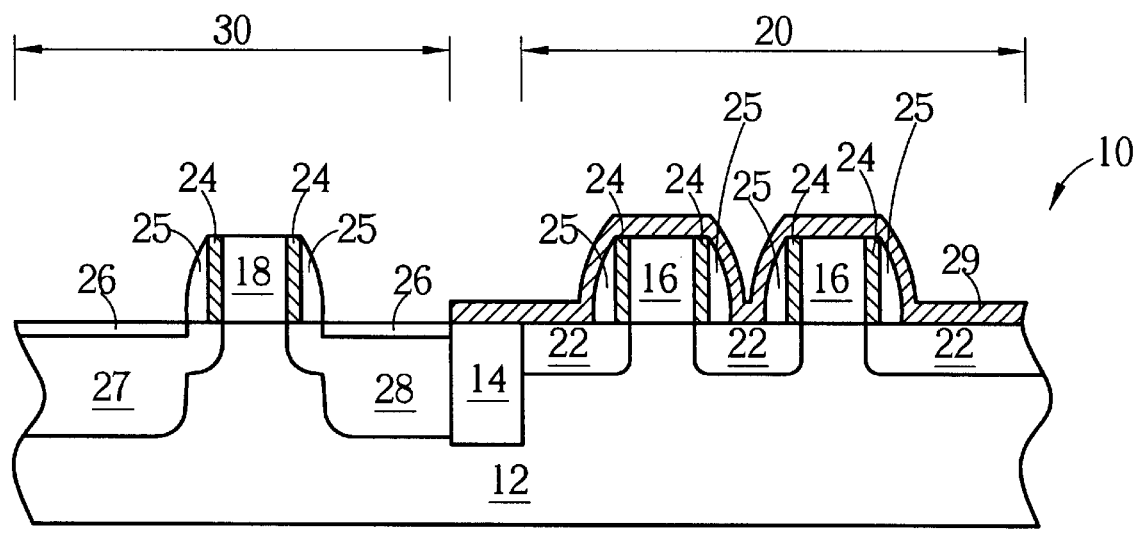
Figure 5:
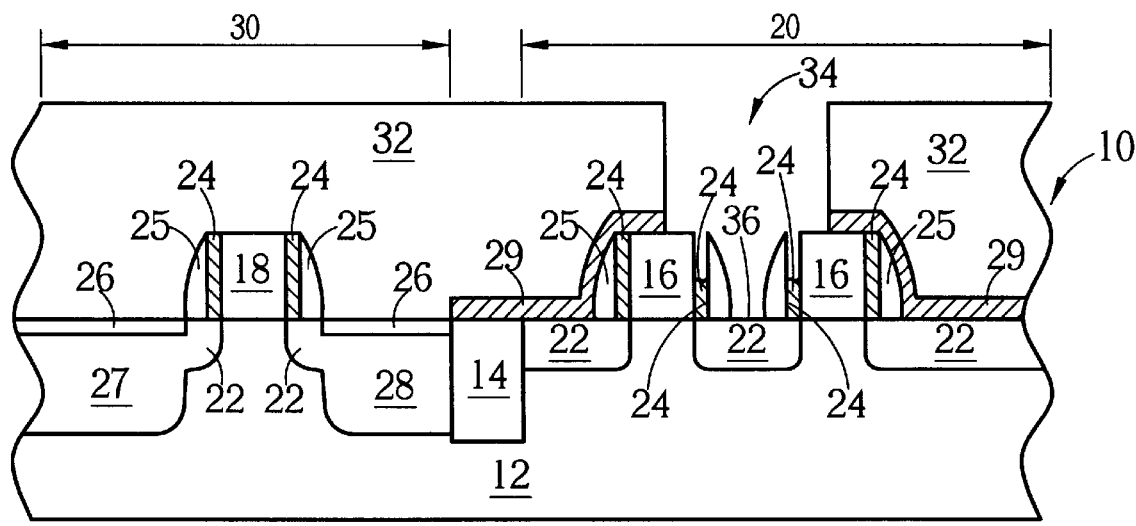
Figure 6:
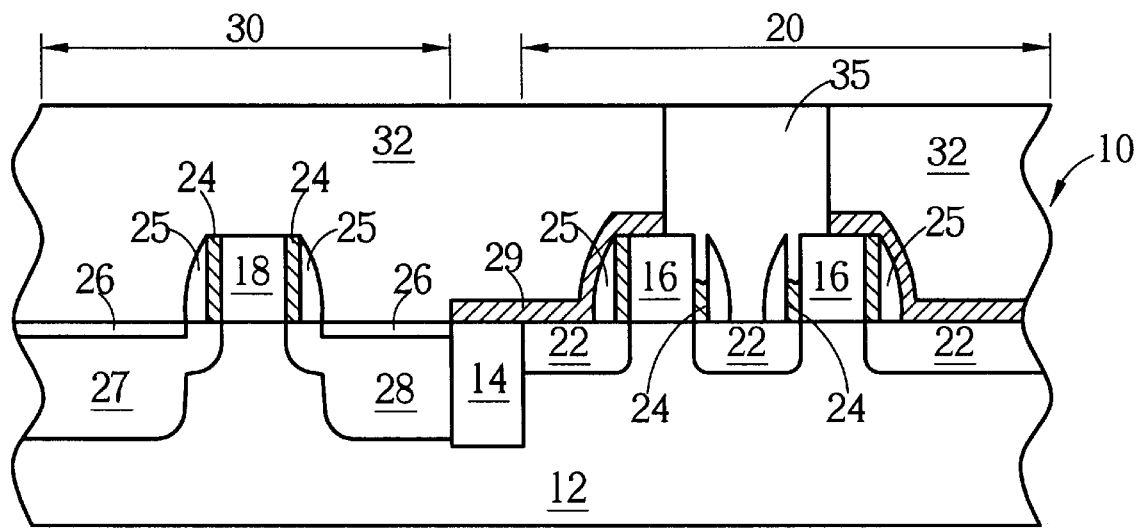
FIG. 6 is a cross-sectional diagram of the prior art method of forming a polysilicon plug in a self-aligned contact hole.
Figure 7:
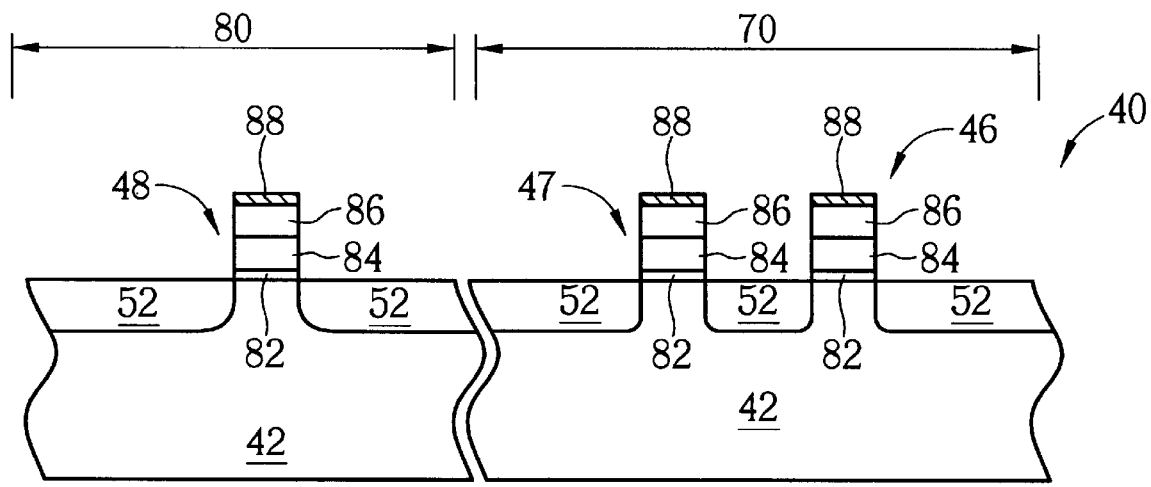
FIG. 7 to FIG. 11 are cross-sectional diagrams of the method of forming a self-aligned contact hole on a semiconductor wafer according to the present invention.

Please refer to FIG. 7 to FIG. 11. FIG. 7 to FIG. 11 are schematic diagrams of the method of forming a self-aligned contact hole 65 on the surface of a substrate 42 of a semiconductor wafer 40 according to the present invention. The present invention relates to a method of forming a self-aligned contact hole 65 on a semiconductor wafer 40. As shown in FIG. 7, the semiconductor wafer 40 comprises the substrate 42, an array area 70 comprising all of the memory cells of a DRAM, and a periphery area 80 comprising a control circuit of a DRAM. The array area 70 and the periphery area 80 are both located on the surface of the substrate 42. The array of memory cells in the array area 70 comprises an active area (not shown), a first gate electrode 46 and a second gate electrode 47 adjacent to the first gate electrode 46. The control circuit in the periphery area 70 comprises at least a third gate electrode 48. Each gate electrode 46, 47, 48 comprises a gate oxide layer 82, a doped poly-silicon layer 84 positioned on the gate oxide layer, a polycide layer 86 positioned on the doped poly-silicon layer 84, and a silicon nitride layer 88 positioned on the polycide layer 86.

Figure 8:
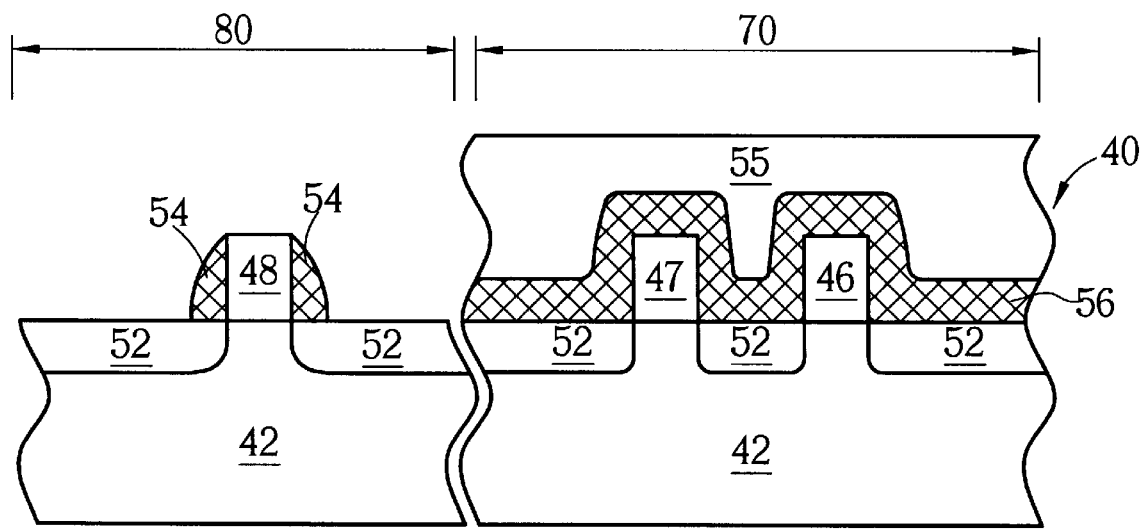

The present invention performs an ion implantation process on semiconductor wafer 40 using phosphorus or arsenic as the dopant, forming lightly doped drain areas 52 beside each gate electrode 46, 47, 48, as shown in FIG. 7. Then spacers 54 are formed on the walls of the two opposite sides of the gate electrode 48, as shown in FIG. 8. The spacers 54 are formed by first forming a silicon oxide dielectric layer 56 to cover the substrate 42 and all of the gate electrodes 46, 47, 48 on the surface of the substrate 42. Next, a photoresist layer 55 is coated onto the surface of the silicon oxide dielectric layer 56. Then, the photoresist layer 55 over the periphery area 80 is removed using lithography and a wet etching procedure. Subsequently, a portion of the silicon oxide dielectric layer 56 in the periphery area 80 is removed by performing a dry etching process. The remainder of the silicon oxide dielectric layer 56 in the periphery area 80 forms the spacers 54 on the walls of the two opposite sides of the gate electrode 48 having a thickness of about 700 Angstroms to 1000 Angstroms. Thereafter, the photoresist layer 55 is removed completely.

Figure 9:
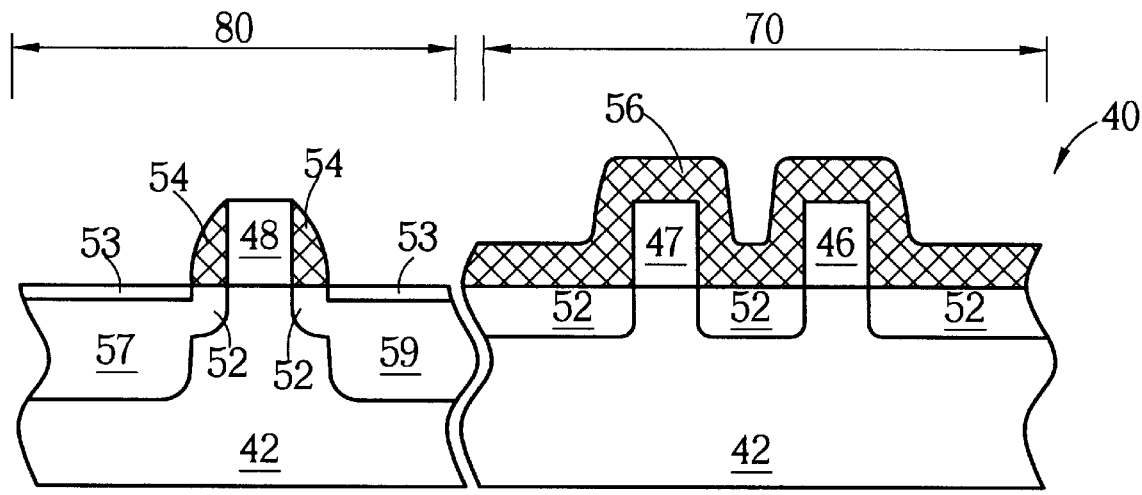

Next, as shown in FIG. 9, after completely removing the photoresist layer 55 over the array area 70, an ion implantation process is performed to form two heavily doped areas adjacent to each of the two spacers 54. These two doped areas are typically implanted with phosphorus or arsenic at a dosage of about $10^{15}$ atoms/cm$^2$, and serve as a source 57 and a drain 59 for the gate electrode 48. Furthermore, a silicide layer 53 is formed on the surface of the source 57 and the drain 59 to reduce their contact resistivity.

Figure 10:
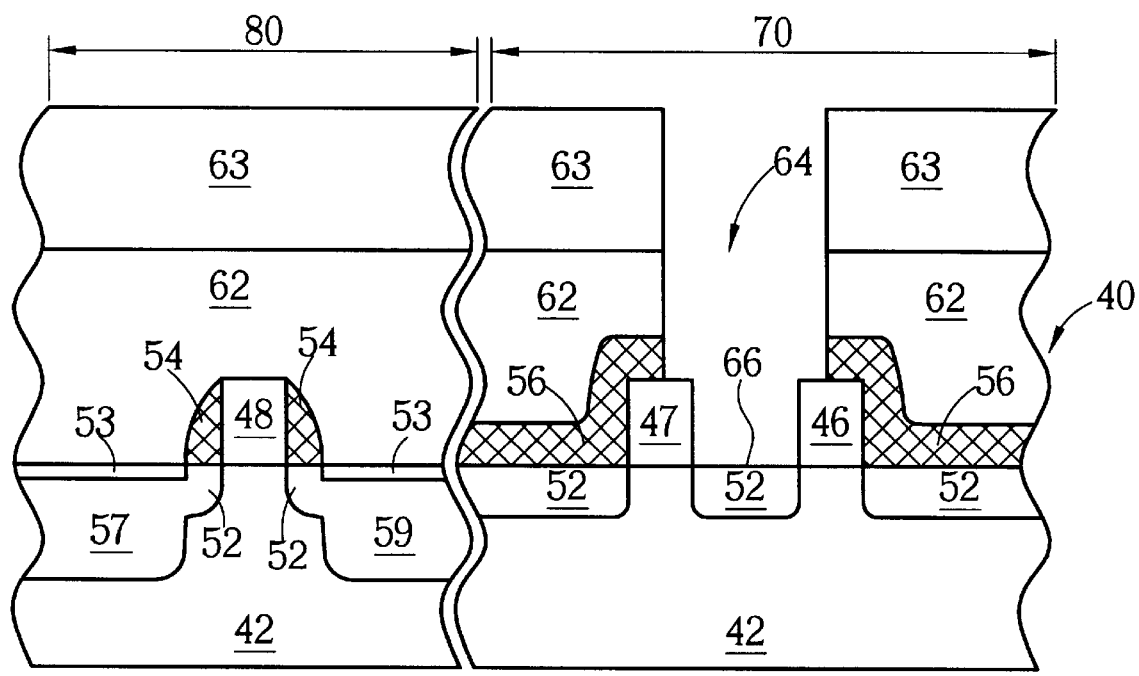

Next, as shown in FIG. 10, the spacers 58 (FIG. 11) are formed on the walls of the gate electrodes 46, 47. The first step of forming the spacers 58 is to use a CVD process to form a silicon oxide dielectric layer 62 that covers the periphery area 80 and the array area 70. Thereafter, a second photoresist layer 63 is coated onto the surface of the silicon oxide dielectric layer 62, and then a lithographic process is performed to form an opening in the photoresist layer 63 in a predetermined area of the array area 70 between the gate electrodes 46, 47. Next, a dry etching process is performed to remove the silicon oxide dielectric layer 62 and the silicon oxide dielectric layer 56 through the opening to the top of the gate electrodes 46 and to the surface of the substrate 42 so as to form the hole 64. The photoresist layer 63 is then completely removed.

Figure 11:
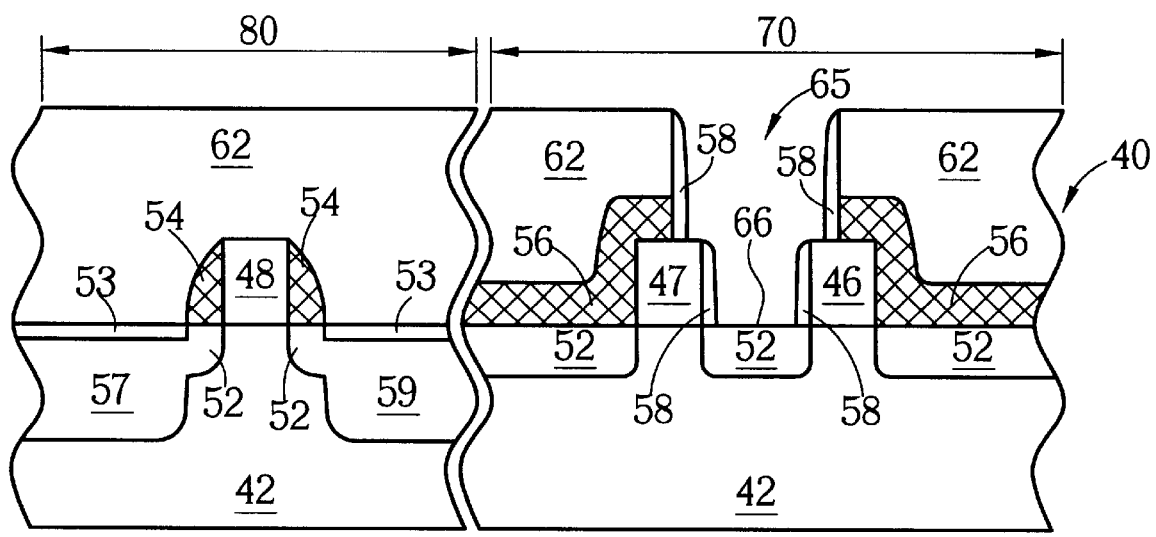

Subsequently, as shown in FIG. 11, a silicon nitride layer (not shown) is formed to uniformly cover the walls and the bottom of the hole 64. Finally, a dry etching process is performed to vertically remove the silicon nitride layer on the top of the silicon oxide dielectric layer 62 and on the top of the gate electrodes 46, 47 and on the surface of the substrate 42, i.e., over the lightly doped drain 52. The remainder of the silicon nitride layer, having a thickness of about 100 Angstroms to 400 Angstroms, on the walls of the gate electrodes 46 and on the vertical faces of the silicon oxide dielectric layer 62, 56 forms the spacers 58 and thereby forms a self-aligned contact hole 65. The spacers 58 act as the internal walls of the self-aligned contact hole 65.

In contrast to the prior art, the method of forming a self-aligned contact hole 65 according to the present invention results in thinner spacers 58 in the array area 70 than the spacers formed by the prior art method. At the time, the method also maintains a sufficient thickness in the spacers of the gate electrode 48 in the periphery area 80. As a result, a larger contact area 66 on the bottom of the self-aligned contact hole 65 is obtained owing to the thin spacers 58. In addition, silicon oxide is used instead of silicon nitride to form the spacers 54 on the walls of the gate electrode 48 in the periphery, area 80 in the present invention. Therefore, there is no need to form a buffer oxide layer, thereby avoiding damage to the buffer oxide layer as seen in the prior art.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a self-aligned contact hole on a semiconductor wafer, the semiconductor wafer comprising:
    a substrate;
    an array area located on the substrate comprising an array of memory cells of a dynamic random access memory (DRAM), the array of memory cells comprising a first gate electrode and a second gate electrode adjacent to the first gate electrode; and
    a periphery area located on the substrate comprising a control circuit of the DRAM, the control circuit comprising at least a third gate electrode;
    the method comprising:
        forming a first doped area over each of two opposite sides of each gate electrode;
        forming a first dielectric layer to cover the substrate and all of the gate electrodes on the surface of the substrate;
        forming a first photoresist layer on the surface of the first dielectric layer;
        performing a lithographic process to remove the first photoresist layer over the periphery area;
        performing a first dry etching process to remove a portion of the first dielectric layer in the periphery area, the remainder of the first dielectric layer in the periphery area forming a first spacer on a wall of each of two opposite sides of the third gate electrode;
        removing the first photoresist layer completely; and
        forming a second spacer on a wall of each of the two opposite sides of the first and second gate electrodes in the array area;
        wherein the first spacers are thicker than the second spacers, and the second spacers between the first and second gate electrodes are internal walls of a self-aligned contact hole between the first and second gate electrodes.

2. The method of claim 1 wherein each of the first doped areas formed adjacent to the third gate electrode is used as a lightly doped drain (LDD).

3. The method of claim 1 further comprising the following steps after completely removing the first photoresist layer:
    performing an ion implantation process to form a doped area on the surface of the substrate adjacent to each of the two first spacers, these two doped areas serving as source and drain for the third gate electrode; and
    forming a silicide layer on the surface of the source and the drain.

4. The method of claim 1 wherein the second spacers are formed by the following steps:
    forming a second dielectric layer to cover the periphery area and the array area;
    forming a hole through the second dielectric layer and the first dielectric layer to the top of the first and the second gate electrodes and to the surface of the substrate in a predetermined area between the first and the second gate electrodes; and
    forming the second spacers on the walls of the hole, the second spacers covering the vertical faces of the second and the first dielectric layers and covering the walls of the first and the second gate electrodes so as to form a self-aligned contact hole between the first and second gate electrodes.

5. The method of claim 4 wherein the hole between the first and second gate electrodes is formed by the following steps:
    forming a second photoresist layer on the surface of the second dielectric layer;
    performing a lithographic process to form an opening in the second photoresist layer in a predetermined area of the array area between the first and the second gate electrodes;
    performing a second dry etching process to remove the second dielectric layer and the first dielectric layer through the opening to the top of the first and the second gate electrodes and to the surface of the substrate so as to form the hole; and
    removing the second photoresist layer completely.

6. The method of claim 4 wherein the second spacers on the walls of the hole are formed by the following steps:
    forming a third dielectric layer to cover the walls and the bottom of the hole; and
    performing a third dry etching process to vertically remove the third dielectric layer on the top of the second dielectric layer and on the top of the first and the second gate electrodes and on the surface of the substrate, the remainder of the third dielectric layer on the walls of the first and the second gate electrodes and on the vertical faces of the first and second dielectric layers thereby forming the second spacers.

7. The method of claim 6 wherein the third dielectric layer is composed of silicon nitride.

8. The method of claim 1 wherein each gate electrode comprises a gate oxide layer, a doped polysilicon layer positioned on the gate oxide layer, a silicide layer positioned on the doped polysilicon layer, and a silicon nitride layer positioned on the silicide layer.

9. The method of claim 4 wherein the first and the second dielectric layers both comprise silicon oxide.

10. The method of claim 9 wherein the silicon oxide is deposited by means of a chemical vapor deposition (CVD) process.

11. The method of claim 1 wherein the thickness of the first spacers is about 700 to 1000 angstroms, and the thickness of the second spacers is about 100 to 400 angstroms.

12. A method of forming a self-aligned contact hole in a semiconductor wafer, the semiconductor wafer comprising:
    a silicon substrate;
    an array area located on the substrate comprising memory cells of a DRAM, at least one active area, a first gate electrode adjacent to a side of the active area, and a second gate electrode adjacent to an opposite side of the active area; and
    a periphery area located on the substrate comprising a control circuit of the DRM, the control circuit comprising at least one third gate electrode;
    the method comprising:
        forming a first doped area over each of two opposite sides of each gate electrode, each of the first doped areas adjacent to the third gate electrode serving as a lightly doped drain (LDD) of the third gate electrode;

forming a first silicon oxide layer to cover the substrate and all of the gate electrodes on the surface of the substrate;

forming a first photoresist layer on the surface of the first silicon oxide layer;

performing a lithographic process to remove the first photoresist layer over the periphery area;

performing a first dry etching process to remove a portion of the first silicon oxide layer in the periphery area, the remainder of the first silicon oxide layer in the periphery area thereby forming the first spacers on the walls of two opposite sides of the third gate electrode;

removing the first photoresist completely;

performing an ion implantation process to form a doped area on the surface of the substrate adjacent to each of the two first spacers, these two doped areas serving as source and drain for the third gate electrode;

forming a silicide layer on the surface of the source and the drain; and forming a second spacer on a wall of each of the two opposite sides of the first gate electrode and the second gate electrode in the active area;

wherein the first spacers are thicker than the second spacers, and the second spacers between the first and second gate electrodes are used as internal walls of a self-aligned contact hole between the first and second gate electrodes.

13. The method of claim 12 wherein the second spacers are formed by the following steps:

forming a second silicon oxide layer to cover the periphery area and the array area;

forming a hole vertically down through the second silicon oxide layer and the first silicon oxide layer to the top of the first and the second gate electrodes and to the surface of the substrate in a predetermined area between the first and the second gate electrodes;

forming a silicon nitride layer to cover the walls and the bottom of the hole;

performing a third dry etching process to remove the silicon nitride layer on the top of the second silicon oxide layer and on the top of the first and the second gate electrodes and on the surface of the substrate, the remainder of the silicon nitride layer on the walls of the first and the second gate electrodes and on the vertical faces of the second silicon oxide layer and the first silicon oxide layer thereby forming the second spacers;

wherein the second spacers form internal walls of a self-aligned contact hole between the first and second gate electrodes.

14. The method of claim 13, wherein the hole between the first and second gate electrodes is formed by the following steps:

forming a second photoresist layer on the surface of the second silicon oxide layer;

performing a lithographic process to form an opening in the second photoresist layer in a predetermined area of the array area between the first and the second gate electrodes in the active area;

performing a second dry etching process to remove the second silicon oxide layer and the first silicon oxide layer down through the opening to the top of the first and the second gate electrodes and to the substrate surface between the first and the second gate electrodes so as to form the hole; and removing the second photoresist layer.

15. The method of claim 12, wherein each gate electrode comprises a gate oxide layer, a doped polysilicon layer positioned on the gate oxide layer, a silicide layer positioned on the doped polysilicon layer, and a silicon nitride layer positioned on the silicide layer.

16. The method of claim 13 wherein the first silicon oxide layer and the second silicon oxide layer and the silicon nitride layer are deposited by means of a chemical vapor deposition (CVD) process.

17. The method of claim 12 wherein the thickness of the first spacers is about 700 to 1000 angstroms, and the thickness of the second spacers is about 100 to 400 angstroms.

* * * * *